US010387610B2

(12) United States Patent
Takamizawa

(10) Patent No.: US 10,387,610 B2
(45) Date of Patent: Aug. 20, 2019

(54) MOTOR CONFIGURATION SELECTION DEVICE, MOTOR CONFIGURATION SELECTION METHOD, AND RECORDING MEDIUM

(71) Applicant: FANUC CORPORATION, Minamitsuru-gun, Yamanashi (JP)

(72) Inventor: Suguru Takamizawa, Yamanashi (JP)

(73) Assignee: FANUC CORPORATION, Yamanashi (JP)

(*) Notice: Subject to any disclaimer, the term of this patent is extended or adjusted under 35 U.S.C. 154(b) by 0 days.

(21) Appl. No.: 16/014,521

(22) Filed: Jun. 21, 2018

(65) Prior Publication Data
US 2019/0026420 A1  Jan. 24, 2019

(30) Foreign Application Priority Data

Jul. 19, 2017  (JP) .................... 2017-140216

(51) Int. Cl.
| G06F 17/50 | (2006.01) |
| H02K 11/20 | (2016.01) |
| H02K 41/02 | (2006.01) |
| H02K 41/03 | (2006.01) |

(52) U.S. Cl.
CPC .......... *G06F 17/5086* (2013.01); *G06F 17/50* (2013.01); *G06F 17/5095* (2013.01); *H02K 11/20* (2016.01); *H02K 41/02* (2013.01); *H02K 41/03* (2013.01); *H02K 2213/03* (2013.01)

(58) Field of Classification Search
CPC ................................................. G06F 17/5086
USPC ...................................................... 318/490, 34
See application file for complete search history.

(56) References Cited

U.S. PATENT DOCUMENTS 4,982,147 A * 1/1991 Lauw .................... H02P 25/024
                                                        318/721

FOREIGN PATENT DOCUMENTS

| JP | 2006-136050 | 5/2006 |
| JP | 2012-141858 | 7/2012 |
| WO | 2013/014780 | 1/2013 |

OTHER PUBLICATIONS

Notification of Reasons for Refusal dated May 7, 2019 in corresponding Japanese Patent Application No. 2017-140216.

* cited by examiner

*Primary Examiner* — David Luo
(74) *Attorney, Agent, or Firm* — Wenderoth, Lind & Ponack, L.L.P.

(57) ABSTRACT

In order to more appropriately select a configuration of a linear motor, a motor configuration selection device includes a specification information acquisition unit that acquires information on specifications of components of a linear motor; a compatibility condition setting unit that sets a compatibility condition for an intended device configuration the linear motor; an evaluation result acquisition unit that acquires an evaluation result for each device configuration of the linear motor that is compatible with the compatibility condition on the basis of preset criteria; and a candidate presentation unit that presents, on the basis of the evaluation result, information on a candidate device configuration for selecting the device configuration of the linear motor.

8 Claims, 6 Drawing Sheets

FIG. 3

| MODEL NAME | SPECIFICATIONS (MODEL NUMBER) | INFORMATION 1 | INFORMATION 2 | ... |
|---|---|---|---|---|
| a | $a_{M1}$ | ... | ... | ... |
| | $a_{M2}$ | | | |
| | ⋮ | | | |
| | $a_{Mk}$ | | | |
| | $a_{C1}$ | | | |
| | $a_{C2}$ | | | |
| | ⋮ | | | |
| | $a_{Cn}$ | | | |
| | ⋮ | | | |
| b | ⋮ | | | |
| ⋮ | ⋮ | | | |

FIG. 4

| INTERNAL DATA GROUP NAME | NUMBER OF USED FIELD COILS | | | | TOTAL NUMBER OF FIELD COILS | NUMBER OF FIELD COIL VARIATIONS | TOTAL COST | Le-La | La-Le | Lb |
|---|---|---|---|---|---|---|---|---|---|---|
| | $a_{M1}$ | $a_{M2}$ | $a_{M3}$ | ... | $a_{Mk}$ | | | | | |
| INTERNAL DATA GROUP 1 | 1 | 2 | 0 | ... | 2 | ... | ... | ... | ... | ... |
| INTERNAL DATA GROUP 2 | | | | | | | | | | |
| INTERNAL DATA GROUP 3 | | | | | | | | | | |
| ... | | | | | | | | | | |
| INTERNAL DATA GROUP Q | | | | | | | | | | |

MOTOR CONFIGURATION SELECTION DEVICE, MOTOR CONFIGURATION SELECTION METHOD, AND RECORDING MEDIUM

This application is based on and claims the benefit of priority from Japanese Patent Application No. 2017-140216, filed on Jun. 19, 2017, the content of which is incorporated herein by reference.

BACKGROUND OF THE INVENTION

Field of the Invention

The present invention relates to a motor configuration selection device, a motor configuration selection method, and a recording medium.

Related Art

Conventionally, a combination of effective stroke and length of a field coil that generates a magnetic field, for example, is determined in accordance with required specifications and the like when selecting the configuration of a linear motor. A technology for selecting the configuration of a linear motor is described in, for example, Patent Literature 1.

Patent Document 1: PCT International Publication No. WO2013/014780

SUMMARY OF THE INVENTION

However, when designing a linear motor, a variety of field coils having different dimensions exist, and hence an appropriate configuration for a linear motor is not always achieved, even when a combination of field coils compatible with, for example, intended effective stroke has been determined, because there are too many field coils, or for other reasons.

It is an object of the present invention to more appropriately select a configuration of a linear motor.

(1) A motor configuration selection device (for example, a motor configuration selection device 1 to be described later) according to one aspect of the present invention includes: a specification information acquisition unit (for example, an internal data generation unit 11c to be described later) that acquires information on specifications of components of a linear motor;

a compatibility condition setting unit (for example, a condition setting unit 11b to be described later) that sets a compatibility condition for an intended device configuration of the linear motor;

an evaluation result acquisition unit (for example, a score setting unit 11d to be described later) that acquires an evaluation result for each device configuration of the linear motor that is compatible with the compatibility condition on the basis of preset criteria; and a candidate presentation unit (for example, a total score calculation unit 11g to be described later) that presents, on the basis of the evaluation result, information on a candidate device configuration for selecting the device configuration of the linear motor.

(2) In the motor configuration selection device of (1), the specifications of the components of the linear motor may include specifications of at least one field coil portion that can be selected for the device configuration of the linear motor.

(3) In the motor configuration selection device of (1) or (2), the compatibility condition setting unit may set, as the compatibility condition for the intended device configuration of the linear motor, any one of a condition that a length of a combination of the components of the linear motor is equal to or larger than a length determined as the intended device configuration of the linear motor; a condition that a length of a combination of the components of the linear motor is equal to or smaller than the length determined as the intended device configuration of the linear motor; and a condition that an absolute value of a difference between a length of a combination of the components of the linear motor and the length determined as the intended device configuration of the linear motor is equal to or less than a preset value.

(4) In the motor configuration selection device of (1) to (3), the motor configuration selection device may further include a priority setting unit (for example, an important requirement setting unit 11e to be described later) that sets priorities to a plurality of the preset criteria; and an evaluation result compensation unit (for example, a weighting processing unit 11f to be described later) that compensates the evaluation result in the device configuration of the linear motor that is compatible with the compatibility condition on the basis of the priorities, in which the candidate presentation unit may present information on the candidate device configuration for selecting the device configuration of the linear motor on the basis of the evaluation result compensated by the evaluation result compensation unit.

(5) In the motor configuration selection on device of (4), the plurality of preset criteria may include: a combination of the components in which the total number of the components of the linear motor is the smallest; a combination of the components in which the total number of the components of the linear motor is the largest; a combination of the components in which variation in the components of the linear motor is the smallest, and a combination of the components in which total cost is the lowest.

(6) In the motor configuration selection device of (1) to (5), the motor configuration selection device may further include a specifying condition reception unit (for example, a UI display control unit 11a to be described later) that accepts a setting of placing a specific component of the linear motor at a specific position in the intended device configuration of the linear motor.

(7) In addition, a motor configuration selection method according to one aspect of the present invention includes the steps of:

acquiring information on specifications of components of a linear motor;

setting a compatibility condition for an intended device configuration of the linear motor;

acquiring an evaluation result for each device configuration of the linear motor compatible with the compatibility condition on the basis of preset criteria; and presenting, on the basis of the evaluation result, information on a candidate device configuration for selecting the device configuration of the linear motor.

(8) In addition, a program according to one aspect of the present invention causes a computer to execute:

a function of acquiring information on specifications of components of a linear motor;

a function of setting a compatibility condition for an intended device configuration of the linear motor;

a function of acquiring an evaluation result for each device configuration of the linear motor compatible with the compatibility condition on the basis of preset criteria; and a function of presenting, on the basis of the evaluation result, information on a candidate device configuration for selecting the device configuration of the linear motor.

According to the present invention, a configuration of a linear motor can be more appropriately selected.

BRIEF DESCRIPTION OF THE DRAWINGS

FIG. 3 is a schematic diagram for illustrating contents of a model information DB.

FIG. 4 is a schematic diagram for illustrating contents of an internal data group DB.

DETAILED DESCRIPTION OF THE INVENTION

An embodiment of the present invention is described below with reference to the drawings.

[Configuration]

Figure 1:
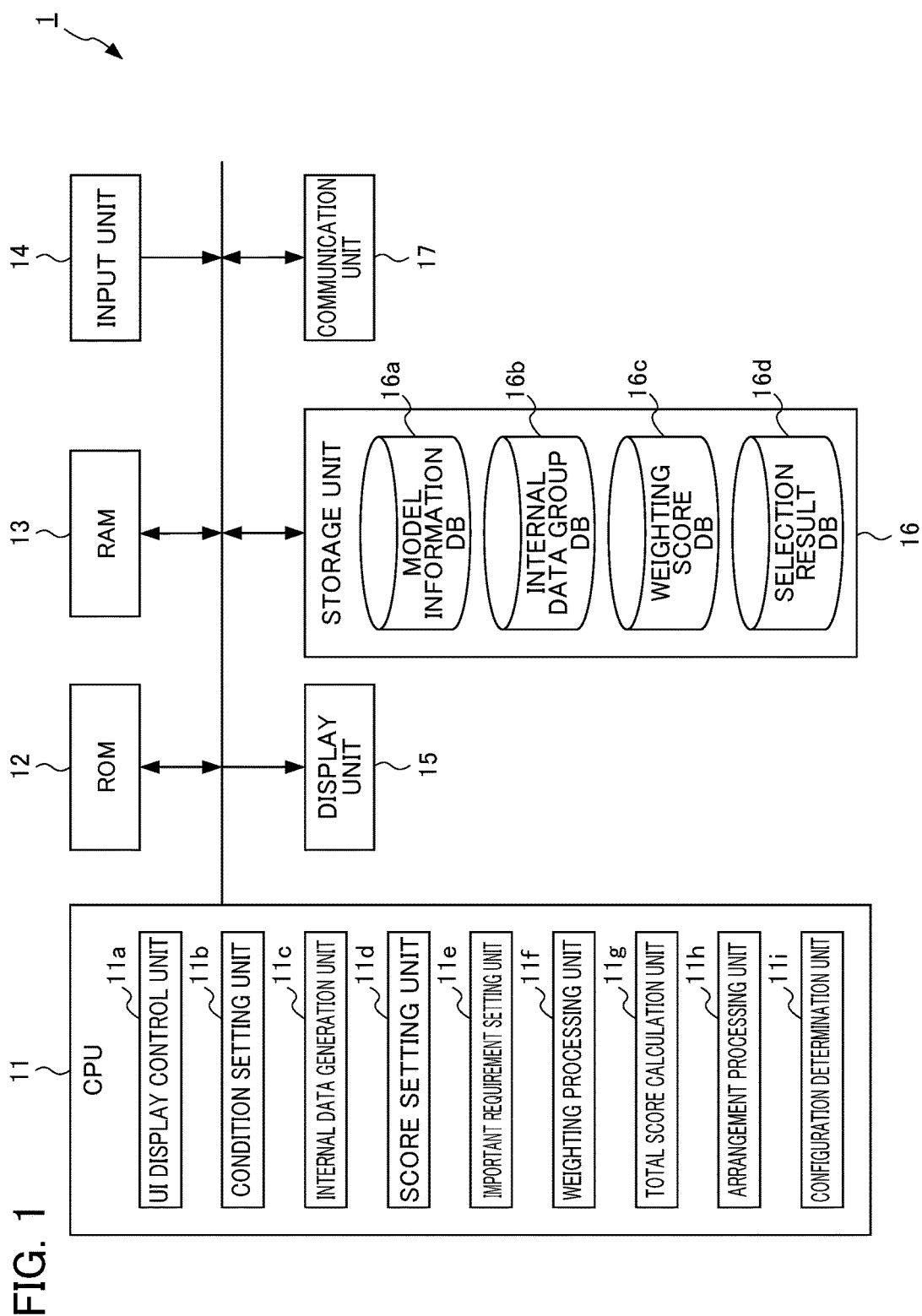
FIG. 1 is a block diagram for illustrating a configuration of a motor configuration selection device according to one embodiment of the present invention.

FIG. 1 is a block diagram for illustrating a configuration of a motor configuration selection device 1 according to one embodiment of the present invention. As illustrated in FIG. 1, the motor configuration selection device 1 includes a central processing unit (CPU) 11, a ROM 12, a RAM 13, an input unit 14, a display unit 15, a storage unit 16, and a communication unit 17.

Figures 2A, 2B:
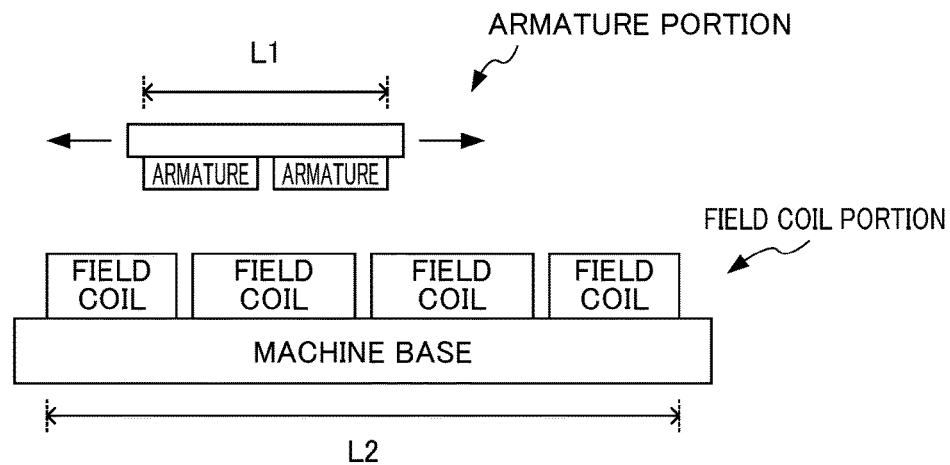
FIG. 2A is a schematic diagram for illustrating a configuration of a linear motor to be selected by the motor configuration selection device.
FIG. 2B is a schematic diagram for ilustrating specifications of components of the linear motor to be selected by the motor configuration selection device.

FIG. 2A is a schematic diagram for illustrating a configuration of a linear motor to be selected by the motor configuration selection device 1, and FIG. 2B is a schematic diagram for illustrating specifications of components of the linear motor to be selected by the motor configuration selection device 1. As illustrated in FIGS. 2A and 2B, a model "A" linear motor is described herein as an example. It is assumed that the model "A" linear motor is provided with field coils having k types of field coil specifications (model numbers) $a_{M1}$ to $a_{Mk}$. In addition, the lengths of the field coils $a_{M1}$ to $a_{Mk}$ are assumed to be $X_{M1}$ to $X_{Mk}$, respectively. In a similar manner, it is assumed that the model "A" linear motor is provided with armatures having n types of armature specifications (model numbers) $a_{C1}$ to $a_{Cn}$, and that the drive direction dimensions of those armatures are $X_{C1}$ to $X_{Cn}$, respectively. The length of the armature portion (if an attachment component is mounted around the armature, then the length. of the armature including this component) in the linear motor is defined as L1, the track length of the field coil portion is defined as L2, and an effective stroke Le is defined as Le=L2−L1.

In FIG. 1, the CPU 11 executes various programs stored in the storage unit 16, to thereby control the entire motor configuration selection device 1. For example, the CPU 11 executes a program for performing processing of selecting a configuration of the linear motor (hereinafter referred to as "motor configuration selection processing"). By executing the program for performing the motor configuration selection processing, a UI display control unit 11a (specifying condition reception unit), a condition setting unit 11b (compatibility condition setting unit), an internal data generation unit 11c (specfication information acquisition unit), a score setting unit 11d (evaluation result acquisition unit), an important requirement setting unit 11e (priority setting unit), a weighting processing unit 11f (evaluation result compensation unit), a total score calculation unit 11g (candidate presentation unit), an arrangement processing unit 11h, and a configuration determination unit 11i are formed in the CPU 11 as the functional configuration of the CPU 11.

In the motor configuration selection processing, the UI display control unit 11a displays a user interface screen (UI screen) to allow a user to input/output various types of information. For example, the UI display control unit 11a displays a combination of field coils in an internal data group for which the total score calculation unit 11g to be described later has calculated the highest score, and displays that information in a format the user can understand. Further, in the motor configuration selection processing, the UI display control unit 11a receives input from the user for placing a specific field coil at a specific position in a stroke.

In the motor configuration selection processing, the condition setting unit 11b sets a condition relating to the linear motor for which a configuration is to be selected. For example, the condition setting unit 11b sets an effective stroke of the linear motor for which a configuration is to be selected in accordance with the input from the user, or sets a condition (hereinafter referred to as "compatible effective stroke condition") that, where $X_{Mi}$ denotes the length of each field coil and $N_{mi}$ denotes the number of field coils, a total length $\Sigma X_{Mi} N_{Mi}$ (1≤i≤k) of a plurality of selected field coils must satisfy an intended effective stroke.

In this embodiment, because there is a possibility that the total length $\Sigma X_{Mi} N_{Mi}$ of the plurality of selected field coils may not match the intended effective stroke, the condition setting unit 11b displays the following conditions A to C on the UI screen as compatible effective stroke conditions. Then, when the user performs an operation (checking a checkbox or the like) of selecting any of these conditions, the condition setting unit 11b sets the selected compatible effective stroke condition and calculates a parameter (a "compatible effective stroke La" or a "difference Lb" to be described later) to be used as the compatible effective stroke condition.

(Compatible Effective Stroke Conditions)

Condition A: Calculate a combination of field coils within a range equal to or below the desired effective stroke.

Condition B: Calculate a combination of field coils within a range equal to or above the desired effective stroke.

Condition C: Calculate a combination of field coils that has the closest numerical value to the desired effective stroke.

The compatible effective stroke condition is a necessary setting condition when performing the motor configuration selection processing. In this embodiment, control is performed so that processing does not proceed to later stages unless the user sets any of the compatible effective stroke conditions. Apart from requiring the user to select the compatible effective stroke condition, the motor configuration selection device 1 may select any of the compatible effective stroke conditions (for example, an existing compatible effective stroke condition is selected automatically if the user does not select any compatible effective stroke condition). Alternatively, any one of the compatible effective stroke conditions A to C may be selected as a default condition (for example, a checkbox is in a checked state). If the compatible effective stroke condition is to be selected, only one condition must be selected. Therefore, when one of the compatible effective stroke conditions is selected, selection of an already selected compatible effective stroke condition is canceled when another compatible effective stroke condition is selected.

In this embodiment, when the condition A is selected, the condition setting unit 11b sets the compatible effective stroke La within the range of 0<La≤Le, and calculates the corresponding compatible field coil portion track length L2a using L2a=La+L1. The compatible effective stroke La represents an effective stroke that satisfies the compatible effective stroke condition, and the compatible field coil portion track length L2a represents a track length of the field coil portion that satisfies the compatible effective stroke condition.

In this embodiment, when the condition B is selected, the condition setting unit 11b sets the compatible effective stroke La within the range of Le≤La≤Le+Δ and calculates the corresponding compatible field coil portion track length L2a using L2a=La+L1. The variable Δ represents an upper limit value of a difference in stroke lengths preset, by the user within the range of Δ>0. In this embodiment, when the condition C is selected, the condition setting unit 11b calculates the difference Lb between the total length of the plurality of selected field coils and the intended effective stroke using the following formula:

$$Lb = |\Sigma X_{Mi} N_{Mi} - Le - L1| (1 \leq i \leq k)$$

The internal data generation unit 11c refers to a model information DB 16a (described later) in the storage unit 16 to specify various combinations (hereinafter referred to as "internal data groups") of field coils that are compatible with a condition set by the condition setting unit 11b. Then, the internal data generation unit 11c stores information on the specified internal data groups in an internal data group DB 16b (described later) in the storage unit 16. For example, the number of used field coils having field coil specifications $a_{M1}$ to $a_{Mk}$, the total number of field coils, the number of field coil variations, the total cost, Le to La or La to Le (error between the effective stroke Le and the compatible effective stroke La), and Lb (difference between the total length of the plurality of selected field coils and the intended effective stroke) are stored as the information on the internal data groups.

In this embodiment, when the condition A is selected, the internal data generation unit 11c stores, as the internal data group, a combination of the field coil specifications and the number of used field coils corresponding to the compatible field coil portion track length L2a. in this embodiment, when the condition B is selected, the internal data generation unit 11c stores a combination of the field coil specifications corresponding to the compatible field coil portion track length L2a and the total number of field coil specifications as the internal data group.

In this embodiment, when the condition C is selected, the internal data generation unit 11c stores all combinations of field coils with which the difference Lb between the total length of the plurality of selected field coils and the effective stroke is at a minimum, and the number of field coils as the internal data groups. However, this excludes any combinations that satisfy the equation $\Sigma X_{Mi} N_{Mi} - L1 \leq 0 (1 \leq i \leq k)$.

For each internal data group generated by the internal data generation unit 11c, the score setting unit 11d sets a score indicating an evaluation result on the basis of various evaluation criteria for selecting a field coil. For example, the score setting unit 11d sets a score for each internal data group such that an internal data group having a smaller total number of field coils has a lower score. A type of score set in this way is classified as a score type T1.

Further, the score setting unit 11d sets a score for each internal data group such that an internal data group having fewer field coil variations has a higher score. A type of score set in this way is classified as a score type T2. The score setting unit 11d sets a score for each internal data group such that an internal data group having a lower total cost has a higher score. A type of score set in this way is classified as a score type T3.

When the condition A is selected, the score setting unit 11d sets a score such that a higher score is set for a smaller value of error (Le-La) between the effective stroke Le and the compatible effective stroke La. A type of score set in this way is classified as a score type t4. When the condition B is selected, the score setting unit 11d sets a score such that a higher score is set for a smaller value of error (La-Le) between the compatible effective stroke La and the effective stroke Le. A type of score set in this way is classified as a score type T5.

When the condition C is selected, the score setting unit 11d sets a score such that a higher score is set for a smaller value of the difference Lb between the total length of the plurality of selected field coils and the intended effective stroke. A type of score set in this way is classified as a score type T6. In this embodiment, it is assumed that the methods of setting each of the score types T1 to T6 are the same. As one example of such a method, there is given a method of setting the score of the internal data group with the highest score to Tmax and decreasing the scores of internal data groups having second and lower scores in order by a score interval d (d>0).

The important requirement setting unit 11e accepts configuration of Selection Criteria (Selection Criteria prioritized by the user) to be prioritized when selecting the field coil. In this embodiment, for example, the following Selection Criteria (1) to (5) are set as the selection criteria to be prioritized when selecting the field coil.

(Selection Criteria)

Selection Criterion (1) Combination of field coils having a minimum total number of field coils Selection Criterion (2) Combination of field coils having a maximum total number of field coils Selection Criterion (3) Combination of field. coils having fewest field coil variations Selection Criterion (4) Combination of field coils having lowest total cost Selection Criterion (5) Combination of field coils under the condition (specification criterion) that a specific field coil is arranged at a specific position The important requirement setting unit 11e displays the Selection Criteria (1) to (5) on the UI screen and accepts input of priority setting for each of these selection criteria. In this embodiment, equal setting for the priority (for example, a plurality of selection criteria is equally set to the highest priority) is permitted. In addition, selection criteria for which a priority has not been set are excluded from consideration in this embodiment. In this embodiment, when the Selection Criterion (5) is selected, input for further setting priority of the Selection Criteria (1) to (4) is accepted for every plurality of strokes divided by a specific field coil arranged at a specific position.

The weighting processing unit 11f performs weighting processing (compensation) on the scores of each internal data group set by the score setting unit 11d on the basis of the priority setting for the selection criteria accepted by the important requirement setting unit 11e. As an example, when a priority Ri ($1 \leq i \leq 5$) is set for the Selection Criterion (1), the weighting processing unit 11f sets the lowest score type T1 of each internal data group set by the score setting unit 11d to −Tmax and adds the score interval d in order of increasing score, to thereby reset the score. In addition, the weighting processing unit 11f multiplies the reset score of each internal data group by a weight $W_{Ri}$ and stores the result as a weighting score type $T1a_{Ri}$ in a weighting score DB 16c in the storage unit 16.

When the priority Ri ($1 \leq i \leq 5$) is set for the Selection Criterion (2), the weighting processing unit 11f multiplies the score type T1 of each internal data group set by the score setting unit 11d by the weight $W_{Ri}$ and stores the result as a weighting score type $T1b_{Ri}$ in the weighting score DB 16c in the storage unit 16. When the priority Ri ($1 \leq i \leq 5$) is set for the Selection Criterion (3), the weighting processing unit 11f multiplies the score type T2 of each internal data group set by the score setting unit 11d by the weight $W_{Ri}$ and stores the result as a weighting score type $T2b_{Ri}$ in the weighting score DB 16c in the storage unit 16.

When the priority Ri ($1 \leq i \leq 5$) is set for the Selection Criterion (4), the weighting processing unit 11f multiplies the score type T3 of each internal data group set by the score setting unit 11d by the weight $W_{Ri}$ and stores the result as a weighting score type $T3b_{Ri}$ in the weighting score DB 16c in the storage unit 16.

When the priority Ri ($1 \leq i \leq 5$) is set for the Selection Criterion (5), the weighting processing unit 11f performs weighting, for example, on the score types T1 to T3 per plurality of strokes divided by a specific field coil arranged at a specific position. In other words, when the Selection Criterion (5) is selected, the weighting processing unit 11f resets the above scores or multiplies the above scores by the weight $W_{Ri}$ per each divided stroke. Then, the weighting processing unit 11f averages (weight-averages) the weighted scores in accordance with a ratio of each stroke to the total effective stroke, to thereby store the weighted average result as a total weighting score type $T5_{Ri}$ in the weighting score DB 16c in the storage unit 16.

The total score calculation unit 11g adds together the weighting score types stored in the weighting score DB 16c for each internal data group to calculate a total score S for each internal data group. As an example, the total score S for each internal data group is calculated by adding together the weighting score types $T1a_{Ri}$, $T2b_{Ri}$, $T3_{Ri}$, and $T5_{Ri}$ stored in the weighting score DB 16c for each internal data group. Any selection criteria for which a priority has not been set by the important requirement setting unit 11e is excluded from consideration because no weighting score type has been calculated therefor.

The total score calculation unit 11g sorts the internal data groups in descending order of the total score S and displays a combination of field coils having an internal data group with the highest total score S on the UI screen. In addition to the internal data group with the highest total score S, the total score calculation unit 11g may display a plurality of combinations of field coils of internal data groups, such as a combination of field coils of an internal data group with the second largest total score S, a combination of field coils of an internal data group with the third largest total score S, and so on.

The arrangement processing unit 11h determines a candidate arrangement of the field coils on the basis of the combination of field coils indicated by the internal data groups. For example, the arrangement processing unit 11h determines the candidate arrangement of the field coils in accordance with a preset arrangement policy (for example, mixing different types of field coils and placing them more evenly) for combinations of field coil arrangements indicated by the internal data group for which the highest total score S has been calculated by the total score calculation unit 11g. Then, the arrangement processing unit 11h displays the determined candidate arrangement of the field coils on the UI screen.

When the candidate arrangement of the field coils determined by the arrangement processing unit 11h is selected by a user on the UI screen, the configuration determination unit 11i determines the selected candidate arrangement of the field coil as the configuration of the linear motor. Then, the configuration determination unit 11i stores the determined linear motor configuration in a selection result DB 16d.

In FIG. 1, various system programs for controlling the motor configuration selection device 1 are pre-written into the ROM 12. The RAM 13 is configured of a semiconductor memory such as a dynamic random access memory (DRAM) and stores data generated when. the CPU 11 performs various types of processing. The input unit 14 is configured of an input device, such as a keyboard or a mouse, or a touch sensor, and accepts various types of information input to the motor configuration selection device 1.

The display unit 15 is configured of a display device such as a liquid crystal display (LCD) and displays various processing results of the motor configuration selection device 1. The storage unit 16 is configured of an nonvolatile storage device such as a hard disk or flash memory and stores programs and the like used for the motor configuration selection processing. In addition, the storage unit 16 stores the model information database (model information DB) 16a for storing information on components (field coil, armature, etc.) that make up a model of the linear motor, the internal data group database (internal data group DB) 16b for storing data on each internal data group generated by the internal data generation. unit 11c, the weighting score database (weighting score DB) 16c for storing the score of each internal data group weighted by the weighting processing unit 11f, and the selection result database (selection result DB) 16d.

FIG. 3 is a schematic diagram for illustrating contents of the model information DB 16a. As illustrated in FIG. 3, the model information DB 16a stores various types of information including model numbers or prices of the components (field coil, armature, etc.) that make up the model of the linear motor. FIG. 4 is a schematic diagram for illustrating contents of the internal data group DB 16b. As illustrated in FIG. 4, the internal data group DB 16b stores data on each internal data group generated by the internal data generation unit 11c. For example, as the data on each internal data group, the internal data group DB 16b stores the number of used field coils with the field coil specifications $a_{M1}$ to $a_{Mk}$, the total number of field coils, the number of field coil variations, the total cost, Le–La or Le–La (error between effective stroke Le and compatible effective stroke La), Lb (difference between total length of the plurality of selected field coils and the intended effective stroke), and others.

In FIG. 1, the communication unit 17 includes a communication interface that performs signal processing on the basis of a predetermined communication standard such as wired/wireless LAN or USB, and controls communication between the motor configuration selection device 1 and other devices.

[Operation]

Next, operation of the motor configuration selection device 1 is described.

[Motor Configuration Selection Processing]

Figure 5:
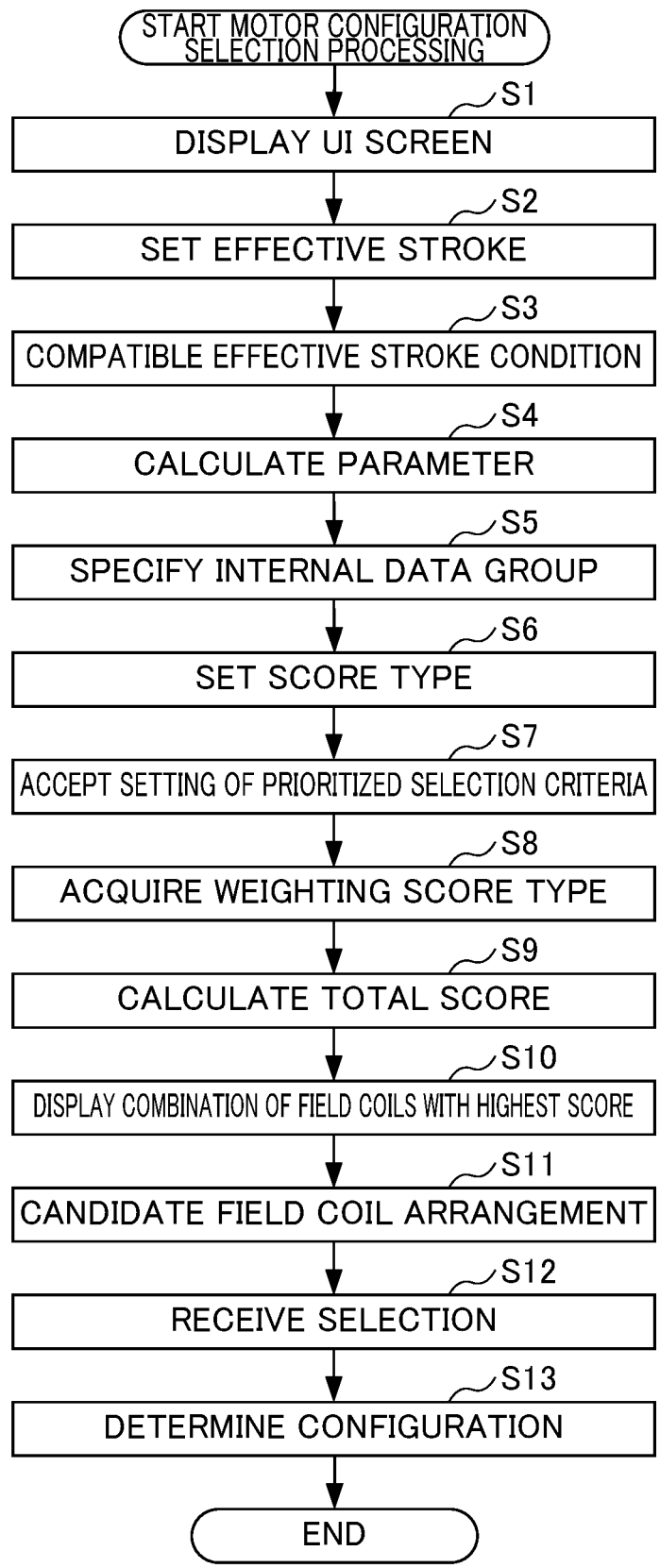
FIG. 5 is a flowchart for explaining flow of motor configuration selection processing performed by the motor configuration selection device.

FIG. 5 is a flowchart for explaining flow of the motor configuration selection processing performed by the motor configuration selection device 1. The motor configuration selection processing starts when a command for starting the motor configuration selection processing is input via the input unit 14.

In Step S1, the UI display control unit 11a displays the UI screen to allow the user to input/output various types of information during the motor configuration selection processing. In Step S2, the condition setting unit 11b sets the effective stroke of the near motor for which a configuration is to be selected based on input by the user. In Step S3, the condition setting unit 11b sets the compatible effective stroke condition based on input by the user.

In Step S4, the condition setting unit 11b calculates a parameter (compatible effective stroke La, difference Lb, etc.) to be used with the compatible effective stroke condition. In Step S5, the internal data generation unit 11c refers to the model information DB 16a in the storage unit 16 to specify various combinations (internal data groups) of field coils that meet the condition using the condition set by the condition setting unit 11b. Information on the specified internal data group is stored in the internal data group DB 16b in the storage unit 16.

In Step S6, the score setting unit 11d sets a score (score type) indicating an evaluation result, for each internal data group generated by the internal data generation unit 11c in accordance with various evaluation criteria for selecting the field coil. In Step S7, the important requirement setting unit 11e accepts setting of the selection criteria (selection criteria prioritized by the user) that are prioritized when selecting the field coil.

In Step S8, the weighting processing unit 11f performs weighting processing on the score of each internal data group set by the score setting unit 11d on the basis of the priority setting relative to the selection criteria accepted by the important requirement setting unit 11e to acquire a weighting score type. The acquired weighting score type is stored in the weighting score DB 16c in the storage unit 16. In Step S9, the total score calculation unit 11g adds together the weighting score types stored in the weighting score DB 16c for each internal data group to calculate the total score S for each internal data group.

In Step S10, the total score calculation unit 11g displays a combination of field coils having an internal data group with the highest total score S on the UI screen. In Step S11, the arrangement processing unit 11h displays a candidate arrangement of the field coils on the UI screen. In Step S12, the configuration determination unit 11i accepts user selection of the candidate arrangement of the field coils displayed on the UI screen. In Step S13, the configuration determination unit 11i determines the selected candidate arrangement of the field coils as the configuration of the linear motor. The determined linear motor configuration is stored in the selection result DB 16d. After Step S13, the motor configuration selection processing ends.

As described above, the motor configuration selection device 1 according to this embodiment sets a compatible effective stroke condition that must satisfy the intended effective stroke, and specifies combinations (internal data groups) of various field coils and armatures that configure the linear motor model. In addition, the motor configuration selection device 1 sets a score indicating evaluation results for each internal data group evaluated with various evaluation criteria and weights the scores in accordance with the selection criteria prioritized by the user. Then, the motor configuration selection device 1 displays the combination of field coils represented by the internal data group having a high total score S obtained by adding together the weighted scores, and the field coil arrangement determined from the combination of field coils. In addition, the motor configuration selection device 1 determines the configuration of the linear motor on the basis of selection by the user. Therefore, in terms of combination of field coils that are compatible with a condition such as the effective stroke, combinations of field coils that achieve a more appropriate configuration can be presented to the user. As a result, with the motor configuration selection device 1, it is possible to more appropriately select a configuration of the linear motor.

[Modification Example 1]

In the above-described embodiment, when the Selection Criterion (5) is selected, input for further setting priority of the Selection Criteria (1) to (4) is accepted per plurality of strokes divided by a specific field coil arranged at a specific position. Alternatively, the following method may be used to determine the arrangement of the field coils when the Selection Criterion (5) is selected. It is assumed that the internal group data is generated as described in the above-described embodiment before the following procedure is carried out.

Figure 6:
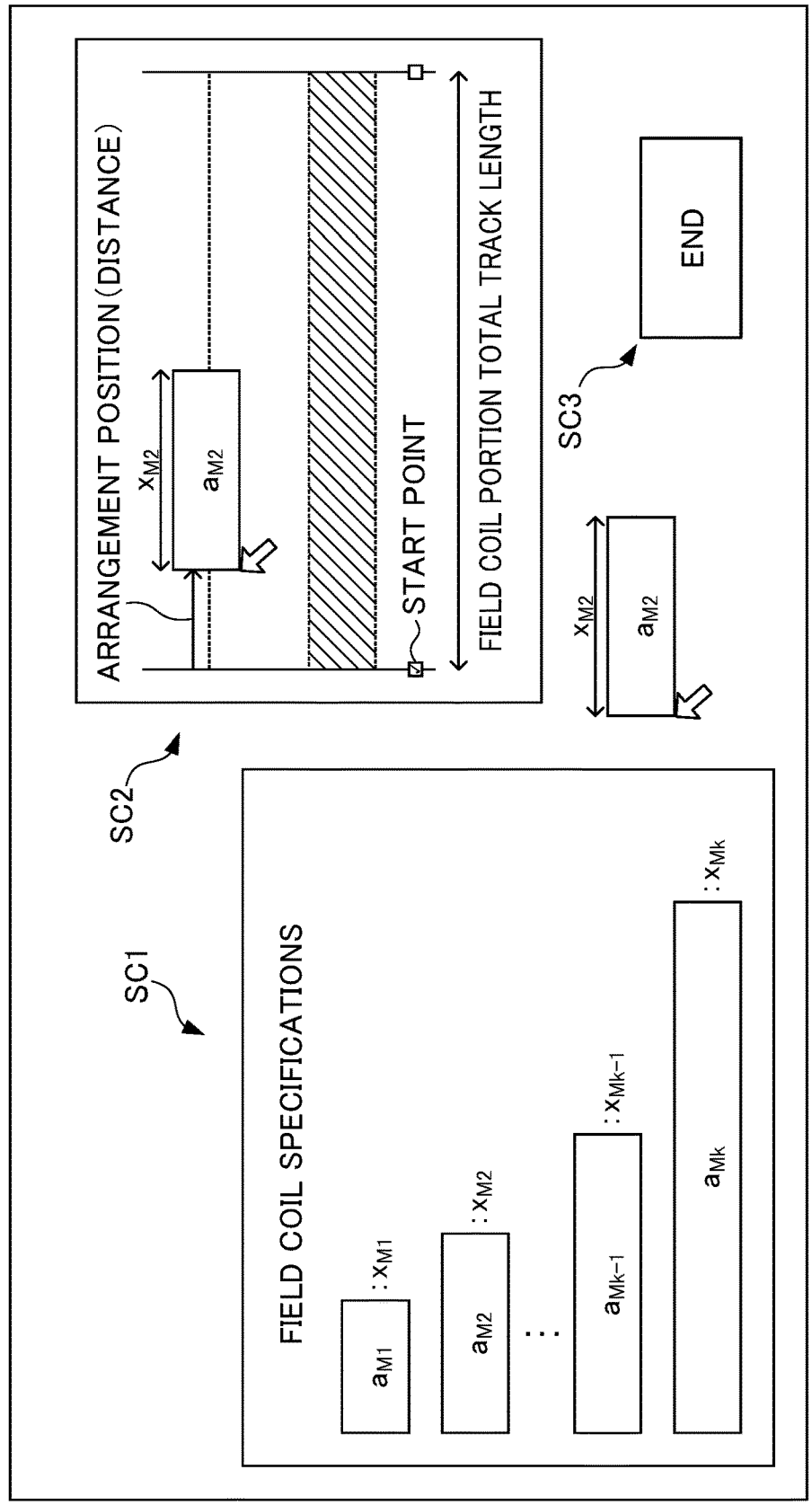
FIG. 6 is a schematic diagram for illustrating an exemplary UI screen that is displayed when Selection Criterion (5) is selected.

FIG. 6 is a schematic diagram for illustrating an exemplary UI screen that is displayed when the Selection Criteron (5) selected. As illustrated in FIG. 6, when the Selection Criterion (5) is selected, the UI display control unit 11a displays a UI screen including a section SC1 in which selectable field coil specifications are displayed, a section SC2 that includes the entire track length of the field coil portion and in which an area for placing the field coil is displayed, and a section SC3 in which a button for inputting determination of the arrangement is displayed. A check box indicating whether the left side or the right side is the start point of the field coil track is also displayed in the section SC2 above the entire track length of the field coil portion. Then, the user performs the following procedure to arrange the field coil.

(Step 1) In the section SC1, the user selects the field coil to be arranged (the UI display control unit 11a has a display form in which an image of the field coil is attached to a mouse cursor corresponding to the selection operation).

(Step 2) The user moves the mouse cursor to the section SC2 and checks either one of the checkboxes indicating the start point of the field coil track (this step may be performed before Step 1).

(Step 3) the user arranges the field coil selected in the section SC1 within the entire field coil track length in the section SC2, provided that the position at which the field coil can be arranged cannot be arbitrarily selected by the user and is limited to a predetermined position determined on the basis of combinations of field coils of each internal data group generated in the above-described embodiment. In other words, in Step 3, the arrangement processing unit 11h refers to each internal data group to specify all cases of which field coil is arranged at which position. Then, the arrangement processing unit 11h stores arrangement position information on each field coil for data on all the specified cases (hereinafter referred to as "all arrangement data"). Correspondence relationships indicating which internal data group each of the all arrangement data corresponds to are also stored with the all arrangement data.

The UI display control unit 11a refers to the arrangement position information on each field coil for the all arrangement data; and the user is required to confirm the arrangement position of the field coil when the field coil is arranged at a possible arrangement position. When the user performs an operation of confirming the arrangement position of the field coil, the UI display control unit 11a displays a UI for the arrangement task of the next field coil (that is, Step 3 is repeated if there is a plurality of specific field coils to be arranged by the user). (Step 4) The user inputs determination of the arrangement by pushing the button in the section SC3 to complete the arrangement task of the field coil (the UI display control unit 11a closes the UI screen).

After the above-described steps have been carried out, the weighting processing unit 11f resets the score of the internal data group that corresponds to the arrangement position (all internal data groups if these groups correspond to a plurality of arrangement positions) of the field coil input by the user. In other words, the weighting processing unit 11f sets the score of the internal data group that corresponds to the arrangement position of the field coil input by the user to Tmax.

For an internal data group not set to Tmax, the weighting processing unit, 11f resets the score thereof such that more points are deducted as a magnitude of disarrangement between the internal data group and the arrangement position of the field coil input by the user increases. For example, the weighting processing unit 11f sets the score such that a predetermined number of points (for example, the score interval d) is deducted per distance R the internal data group is separated from the arrangement position of the field coil input by the user. The predetermined number of points in this embodiment is not limited to the score interval d and can be arbitrarily set. As one example, when the number of field coils input by the user is 1, the magnitude of disarrangement between the internal data group and the arrangement position of that field coil is divided every distance R and a cumulative number of the score intervals d that correspond to the divisions that determine the magnitude of disarrangement is subtracted from Tmax. For example, when the magnitude of disarrangement is a division larger than R and equal to or less than 2R, the score of the internal data group is Tmax−2d.

When the number of field coils input by the user is more than 1, the cumulative number of the score intervals d is determined from the magnitudes of disarrangement from each of the field coils and the average of that cumulative value is subtracted from Tmax. For example, when the average of deducted points determined from the disarrangements at the arrangement positions of the field coils is dav, the score of the internal data group is Tmax−dav. Because one internal data group represents a combination of field coils, a plurality of specific field coil arrangements can be realized. Therefore, a pjurality of scores can be set for one internal data group and, in this case, the weighting processing unit 11f uses the highest score for the score of the internal data group.

In this embodiment, the data representing the arrangement position information in the all arrangement data may be, for example, in the form of data which consecutively stores information on each field coil in row-orientated cells in spreadsheet software. Using this type of data format makes it easy to understand what type of field coil is arranged at which position from the right edge or the left edge. In addition, the arrangement position (coordinates) of each field coil can be easily calculated. For example, the arrangement position of the field coil for which the arrangement position is to be calculated can be easily calculated by reading, from the model information DB 16a, and adding the field coil lengths stored in each cell from the cell at the end of the row to the cell where the field coil whose arrangement position is to be calculated is stored.

The present invention is not limited to the above-described embodiment and modification example and can be changed or modified in various ways. For example, in the above-described embodiment and modification example, a specific numerical value such as weight used for the score set for the internal data group or the weighting processing can be changed as appropriate to meet a user request or specifications of a motor that is to undergo selection by the motor configuration selection device 1 within a scope that does not deviate from the technical spirit of the invention. Further, the method of calculating the score can be applied to a motor other than the linear motor. In the above-described embodiment, coasting distance of the armature portion may be added to the track length of the field coil portion to select the motor.

In the above-described embodiment, the motor configuration selection device 1 includes the model information DB 16a, the internal data group DB 16b, the weighting score DB 16c, and the selection result DB 16d, but the motor configuration selection device 1 is not limited to this configuration in other words, there may be adopted a configuration in which another device (for example, a database server) capable of communication over a network may include all or a part of these databases, and the motor configuration selection device 1 may access that database via the network as necessary.

The functions of the motor configuration selection device 1 according to the above-described embodiment can be wholly or partly implemented by hardware, software, or a combination of hardware and software. In this specification, "implement by software" means implementing a function through a processor reading and executing a program. If using hardware, the functions of the motor configuration selection device 1 can be wholly or partly implemented by, for example, an integrated circuit (IC) such as an application specific integrated circuit (ASIC), a gate array, a field programmable gate array (FPGA), or complex programmable logic device (CPLD).

If using software, all or some of the functions of the motor configuration selection device 1 can be implemented by using a computer including a hard disk that stores a program including all or some of the operation of the motor configuration selection device 1, a storage unit such as a ROM, a DRAM that stores data necessary for computation, a CPU, and a bus to connect those components to one another to store the data necessary for computation in the DRAM and operate the program with the CPU.

These programs can be stored and supplied to a computer using various types of computer readable medium. The computer readable medium includes various types of tangible storage medium. Examples of the computer readable medium include a magnetic recording medium (for example, a flexible disk, magnetic tape, and a hard disk drive), a magneto-optical recording medium (for example, a magneto-optical disk), a CD-ROM (read only memory), a CD-R, a CD-R/W, a digital versatile disk (DVD-ROM), a DVD-R, a DVD-R/W, and a semiconductor memory (for example, a mask ROM, a programmable ROM (PROM), an erasable PROM (EPROM), a flash memory, or a random access memory (RAM)). These programs may be distributed by being downloaded to a computer of the user via a network.

An embodiment of the present invention has been described in detail above, but the above-described embodiment, is merely a specific, example of embodiment of the present invention and is not intended to limit the technical scope of the present invention. Various changes may be made to the present invention without departing from the spirit thereof, and those changes are also included in the technical scope of the present invention.

EXPLANATION OF REFERENCE NUMERALS 1 motor configuration selection device
11 CPU
11a UI display control unit (specifying condition reception unit)
11b condition setting unit (compatibility condition setting unit)
11c internal data generation unit (specification information acquisition unit)
11d. score setting unit (evaluation result acquisition unit)
11e important requirement setting unit (priority setting unit)
11f weighting processing unit (evaluation result compensation unit)
11g total score calculation unit (candidate presentation unit)
11h arrangement processing unit
11i configuration determination unit
12 ROM
13 RAM
14 input unit
15 display unit
16 storage unit
16a model information database
16b internal data group database
16c weighting score database
16d selection result database
17 communication unit

What is claimed is:

1. A motor configuration selection device, comprising:
a specification information acquisition unit that acquires information on specifications of components of a linear motor;
a compatibility condition setting unit that sets a compatibility condition for an intended device configuration of the linear motor;
an evaluation result acquisition unit that acquires an evaluation result for each device configuration of the linear motor that is compatible with the compatibility conditions on the basis of preset criteria; and
a candidate presentation unit that presents, on the basis of the evaluation result, information on a candidate device configuration for selecting the device configuration of the linear motor.

2. The motor configuration selection device according to claim 1, wherein the specifications of the components of the linear motor include specifications of at least one field coil portion that can be selected for the device configuration of the linear motor.

3. The motor configuration selection device according to claim 1, wherein the compatibility condition setting unit sets, as the compatibility condition for the intended device configuration of the linear motor, any one of a condition that a length of a combination of components of the linear motor is equal to or larger than a length determined as the intended device configuration of the linear motor; a condition that a length of a combination of components of the linear motor is equal to or smaller than the length determined as the intended device configuration of the linear motor; and a condition that an absolute value of a difference between the length of the combination of components of the linear motor and the length determined as the intended device configuration of the linear motor is equal to or less than a preset value.

4. The motor configuration selection device according to claim 1, further comprising:
a priority setting unit that sets priorities to a plurality of the preset criteria; and
an evaluation result compensation unit that compensates the evaluation result in the device configuration of the linear motor that is compatible with the compatibility condition on the basis of the priorities,
wherein the candidate presentation unit presents information on the candidate device configuration for selecting the device configuration of the linear motor on the basis of the evaluation result compensated by the evaluation result compensation unit.

5. The motor configuration selection device according to claim 4, wherein the plurality of preset criteria includes: a combination of the components in which the total number of the components of the linear motor is the smallest; a combination of the components in which the total number of the components of the linear motor is the largest; a combination of the components in which variation in the components of the linear motor is the smallest; and a combination of the components in which total cost is the lowest.

6. The motor configuration selection device according to claim 1, further comprising:
a specifying condition reception unit that accepts a setting of placing a specific component of the linear motor at a specific position of the intended linear motor device configuration.

7. A motor configuration selection method, comprising the steps of:
acquiring information on specifications of components of a linear motor;
setting a compatibility condition for an intended device configuration of the linear motor;
acquiring an evaluation result for each device configuration of the linear motor compatible with the compatibility condition on the basis of preset criteria; and
presenting, on the basis of the evaluation result, information on a candidate device configuration for selecting the device configuration of the linear motor.

8. A non-volatile recording medium storing a program for causing a computer to execute:
a function of acquiring information on specifications of components of a linear motor;
a function of setting a compatibility condition for an intended device configuration of the linear motor;
a function of acquiring an evaluation result for each device configuration of the linear motor compatible with the compatibility condition on the basis of preset criteria; and
a function of presenting, on the basis of the evaluation result, information on a candidate device configuration for selecting the device configuration of the linear motor.

* * * * *